(12) United States Patent
Hoenigschmid et al.

(10) Patent No.: US 7,518,902 B2
(45) Date of Patent: Apr. 14, 2009

(54) RESISTIVE MEMORY DEVICE AND METHOD FOR WRITING TO A RESISTIVE MEMORY CELL IN A RESISTIVE MEMORY DEVICE

(75) Inventors: Heinz Hoenigschmid, Poecking (DE); Milena Dimitrova, Munich (DE); Corvin Liaw, Munich (DE); Michael Angerbauer, Palling (DE)

(73) Assignee: Infineon Technologies AG, Munich (DE)

( * ) Notice: Subject to any disclaimer, the term of this patent is extended or adjusted under 35 U.S.C. 154(b) by 23 days.

(21) Appl. No.: 11/318,331

(22) Filed: Dec. 23, 2005

(65) Prior Publication Data

US 2007/0171697 A1    Jul. 26, 2007

(51) Int. Cl.
*G11C 11/00* (2006.01)
(52) U.S. Cl. ............... 365/148; 365/158; 365/163; 365/189.16
(58) Field of Classification Search ............. 365/148, 365/158, 163
See application file for complete search history.

(56) References Cited

U.S. PATENT DOCUMENTS

| | | | | |
|---|---|---|---|---|
| 6,731,528 | B2 * | 5/2004 | Hush et al. | 365/100 |
| 6,754,107 | B2 | 6/2004 | Khouri et al. | |
| 2004/0160819 | A1 * | 8/2004 | Rinerson et al. | 365/171 |
| 2004/0228163 | A1 * | 11/2004 | Khouri et al. | 365/154 |
| 2005/0152202 | A1 * | 7/2005 | Choi et al. | 365/226 |
| 2006/0007771 | A1 * | 1/2006 | Sato | 365/226 |
| 2006/0067147 | A1 * | 3/2006 | Roehr | 365/207 |
| 2006/0221734 | A1 * | 10/2006 | Bedeschi et al. | 365/201 |
| 2007/0041251 | A1 * | 2/2007 | Roehr | 365/189.09 |
| 2007/0236987 | A1 * | 10/2007 | Cho et al. | 365/163 |

FOREIGN PATENT DOCUMENTS

WO     03/054887     7/2003

* cited by examiner

*Primary Examiner*—VanThu Nguyen
*Assistant Examiner*—Han Yang
(74) *Attorney, Agent, or Firm*—Dicke, Billig & Czaja, PLLC

(57) ABSTRACT

A memory device and method of operating the same. In one embodiment, the memory device includes a resistive memory cell including a resistive memory element wherein the resistive memory element is designed to acquire a low resistance state when applying a programming voltage and acquire to a high resistance state when applying an erasing voltage; and wherein the writing time for changing the resistance state of the resistive memory element can be relatively reduced.

23 Claims, 3 Drawing Sheets

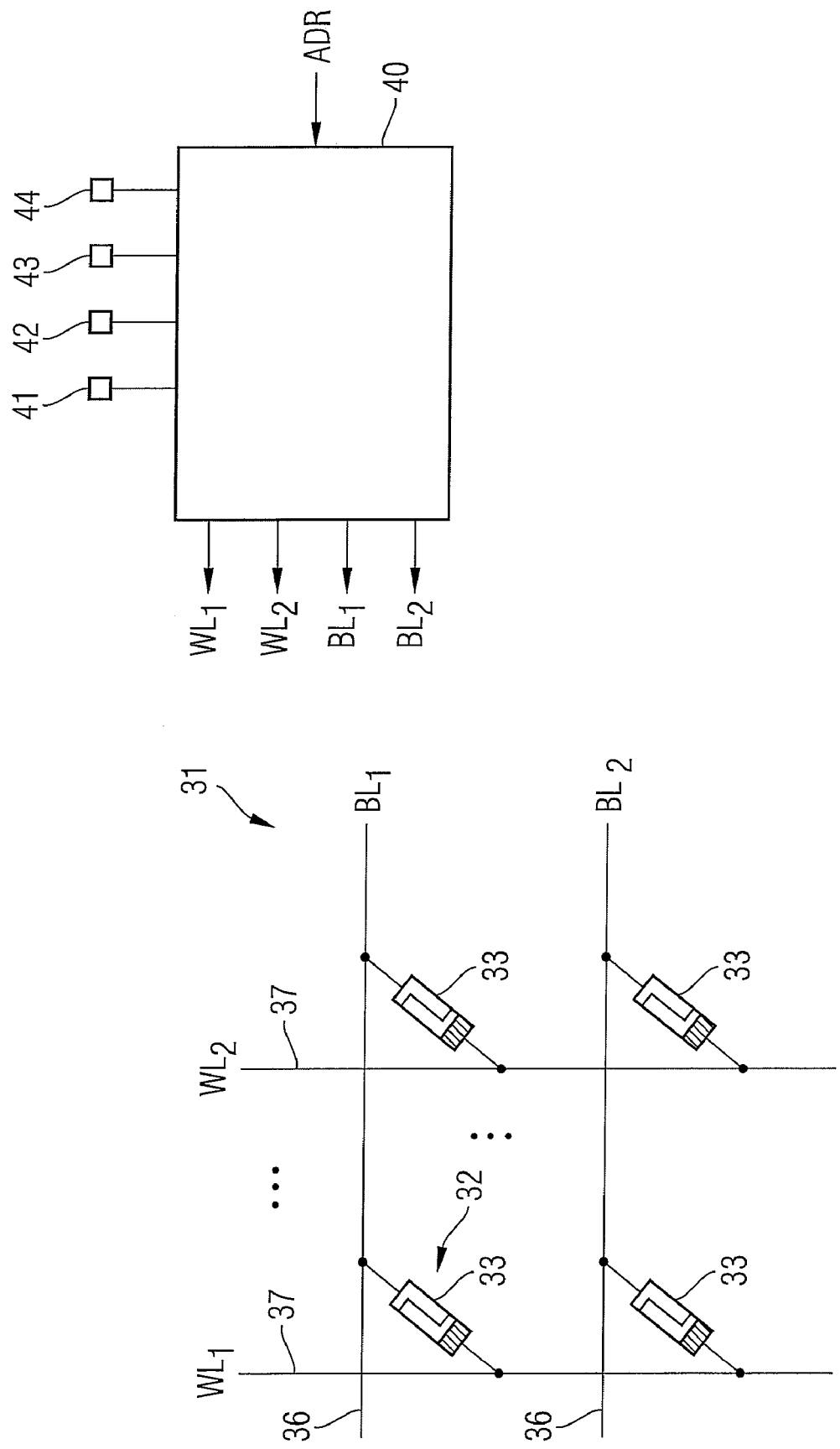

RESISTIVE MEMORY DEVICE AND METHOD FOR WRITING TO A RESISTIVE MEMORY CELL IN A RESISTIVE MEMORY DEVICE

BACKGROUND OF THE INVENTION

1. Field of the Invention

The present invention is related to a Conductive Bridge Random Access Memory (CBRAM) memory device having a plurality of resistive memory cells. The invention is further related to a method for writing to resistive memory cells in a CBRAM memory device.

2. Description of the Related Art

A CBRAM memory device (also called a PMC memory device, PMC: Programmable metallization cell, and a PCRAM memory device, PC: programmable conductor) includes a plurality of resistive memory cells. The resistive memory cells each comprise a resistive memory element and, optionally, depending on the design of the CBRAM memory device a selection transistor for addressing the respective resistive memory cell. The resistive memory element formed by a PMC element, for instance, comprise a solid state electrolyte (e.g. a chalcogenide material) in which an electrically conductive path can be established or degenerated depending on the electrical field applied thereon. Thereby, different resistance states can be acquired in the resistive memory element which can be utilized to store an information.

In a resistive memory element in which two different resistance states can be set a first low resistance state can be acquired by applying a voltage (electrical field) which is higher than a programming threshold voltage and a high resistance state can be acquired by applying a voltage (electrical field) which is lower than an erasing threshold voltage. Usually the programming threshold voltage and the erasing threshold voltage are reverse in sign.

Provided that the CBRAM memory device is supplied by an externally provided operating voltage two main concepts for writing into a resistive memory cell are known. In one concept, in a CBRAM memory device the resistive memory element is coupled with a common electrode which is usually called plate element and a further terminal of the resistive memory element is coupled or can be coupled with a bit line. Usually the plate electrode is hold on a constant reference potential which is set as a potential which is in the middle between a high operating potential and a low operating potential supplied to the CBRAM memory device as the operating voltage. A positive electrical field can be applied on the resistive memory element by connecting the bit line with the high operating potential, and a negative electrical field can be applied by connecting the bit line with the low operating potential or vice versa depending on the polarity of the resistive memory element. Thereby, the programming or erasing voltage for changing the resistance state of the resistive memory element is then about the half of the operating voltage.

In a further concept the plate potential is not set to constant potential but to one of the high and the low operating potential and the further terminal of the resistive memory element to the low and high operating potential, respectively depending on the resistance state which is to be written to the resistive memory element. In this concept, the maximum voltage for programming and for erasing equals the operating voltage.

The time for changing the resistance state of a resistive memory element depends substantially on the applied programming and erasing voltage, respectively. Thus, the minimum time which is needed for re-writing the resistive memory element is predetermined.

SUMMARY OF THE INVENTION

It is therefore an object of the present invention to provide a memory device and a method for writing to a resistive memory cell in the memory device wherein the writing time for changing the resistance state of the resistive memory element can be reduced.

According to one embodiment of the present invention a memory device is provided. The memory device comprises a resistive memory cell including a resistive memory element wherein the resistive memory element may be operable to acquire a low resistance state when applying a programming voltage and acquire a high resistance state when applying an erasing voltage. The memory device further includes operating voltage ports for receiving a high operating potential and a low operating potential, an addressing logic which is operated by the operating voltage and at least one writing potential element for providing a writing potential wherein the writing potential is either higher than the high operating potential or lower than or equal to the low operating potential, wherein the addressing logic is operable to connect the writing potential element with the resistive memory element to apply the writing potential in a write mode.

The CBRAM memory device according to the present invention allows to increase the voltage (and so the electrical field) to be applied to the resistive memory element of a resistive memory cell in a write mode beyond a voltage which is able to be applied to the resistive memory element merely by means of the operating potentials. So it can be achieved that the writing to a resistive memory cell can be sped up as the programming voltage and the erasing voltage, respectively, are boosted beyond the operating voltage.

According to a further embodiment of the present invention the CBRAM memory device comprises a selection transistor included in the resistive memory cell and coupled with its first terminal to a first terminal of the resistive memory element, a word line coupled to the gate terminal of the selection transistor, a bit line coupled to a second terminal of the selection transistor and a plate element connected with a second terminal of the resistive memory element and providing a plate potential. The addressing logic is designed to control the word line and the bit line such that in the write mode the writing potential is applied on the bit line while the selection transistor is closed, i.e. made conductive.

Furthermore, the addressing logic is designed to control the plate element such that a voltage is applied on the resistive memory element which is higher than the voltage difference between the high and the low operating potentials.

It can be provided that the addressing logic is designed to control the plate element such that the low operating potential is applied as the plate potential if the writing potential which is higher than the high operating potential is applied to the bit line. Alternatively, it can be provided that the addressing logic is designed to control the plate element such that the high operating potential is applied as the plate potential if the writing potential that is lower than or equal to the low operating potential is applied to the bit line.

According to an alternative embodiment of the present invention, the plate element may provide a constant plate potential which is between one of the high and the low writing potentials and the writing potential.

Furthermore, a switch can be included in the addressing logic to selectively couple the bit line with the writing potential element in the write mode.

According to another embodiment of the present invention a first terminal of the resistive memory element is connected with a word line and the second terminal of the resistive memory element is connected with a bit line wherein the addressing logic is designed to apply either on the bit line or on the word line the writing potential wherein the respective other one of the word line and the bit line is coupled with one of the operating potentials such that in the write mode a voltage applied on the resistive memory element exceeds the operating voltage.

Furthermore, the writing potential may be applied by an internal voltage source or by an external writing potential port.

According to another aspect of the present invention a method for writing to a resistive memory cell in a CBRAM memory device is provided which comprises the steps of providing a high operating potential and a low operating potential to the memory device for operating an addressing logic; of supplying a plate potential to a first terminal of the resistive memory element; and in a write mode, of providing a writing potential on a second terminal of the resistive memory element wherein the writing potential is either higher than the high operating potential or equal to or lower than the low operating potential.

The method of the present invention allows a writing to the resistive memory cell such that the writing voltage applied on the resistive memory element during the writing is higher than it would be possible using the operating voltage. Thereby, it can be achieved that the writing of information into the resistive memory cell is performed faster than by merely applying a voltage equal or less than the operating voltage.

According to another embodiment of the present invention a selection transistor is closed before applying the writing potential to the second terminal of the resistive memory element.

Furthermore, a plate potential is controlled such that a voltage is applied on the resistive memory element which is higher than the voltage difference between the high and the low operating potentials.

The plate potential may be controlled such that the low operating potential is applied as the plate potential if a writing potential which is higher than the high operating potential is applied to the bit line. Alternatively the plate potential may be controlled such that the high operating potential is applied as the plate potential if a writing potential which is lower than the low operating potential is applied to the bit line. Furthermore, the plate potential may be set as a constant potential which is selected between the writing potential and one of the high and the low operating potentials.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 shows schematically a portion of a CBRAM memory device according to another embodiment of the present invention.

DETAILED DESCRIPTION OF THE PREFERRED EMBODIMENT

One idea of the present invention is to increase the programming voltage and the erasing voltage, respectively, to reduce the writing time which is needed for writing a specific resistance state into a resistive memory element. This is achieved by applying an increased programming voltage and erasing voltage, respectively to the resistive memory element such that the resistance state is changed in a shorter time than it would be possible by merely applying the operating voltage or a voltage which is lower than the operation voltage.

Figure 1:
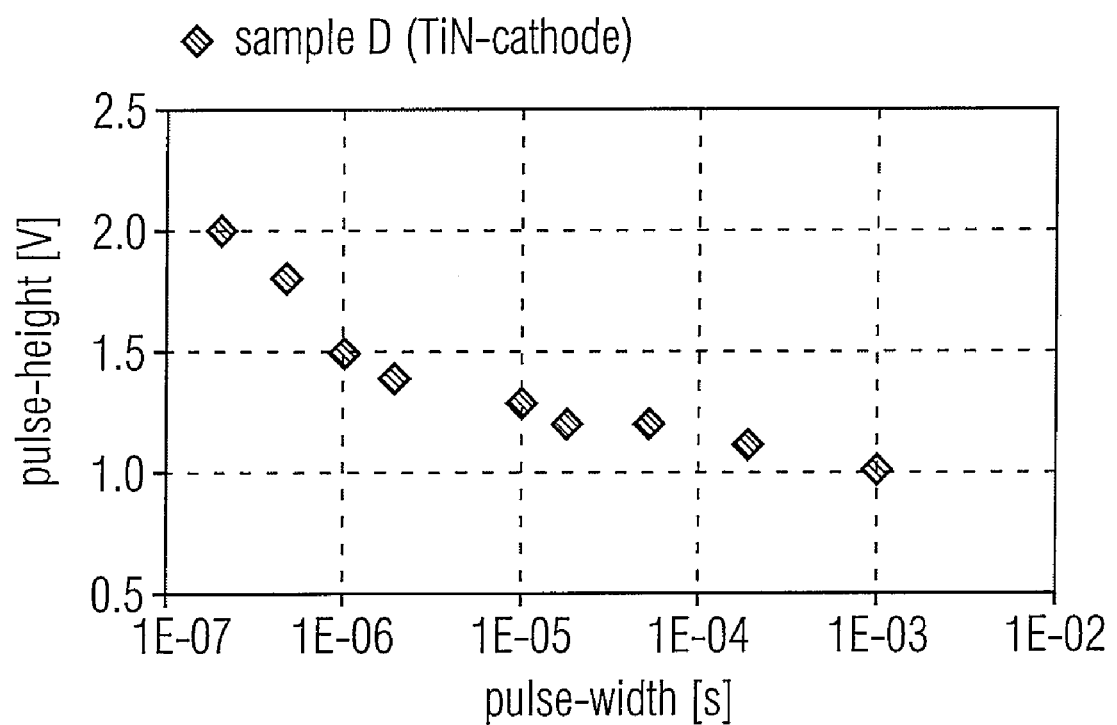
FIG. 1 shows a graph indicating a relationship between a value of a writing pulse and the pulse width (in seconds)

In FIG. 1 a characteristic is shown indicating parameters of a writing pulse applied to the resistive memory element to change the respective resistance state. In detail, it shows the writing voltage over a time which is needed until the required resistance state has been achieved in the resistive memory element. It is noted that the writing time can be substantially decreased when the writing voltage is increased.

Figure 2:
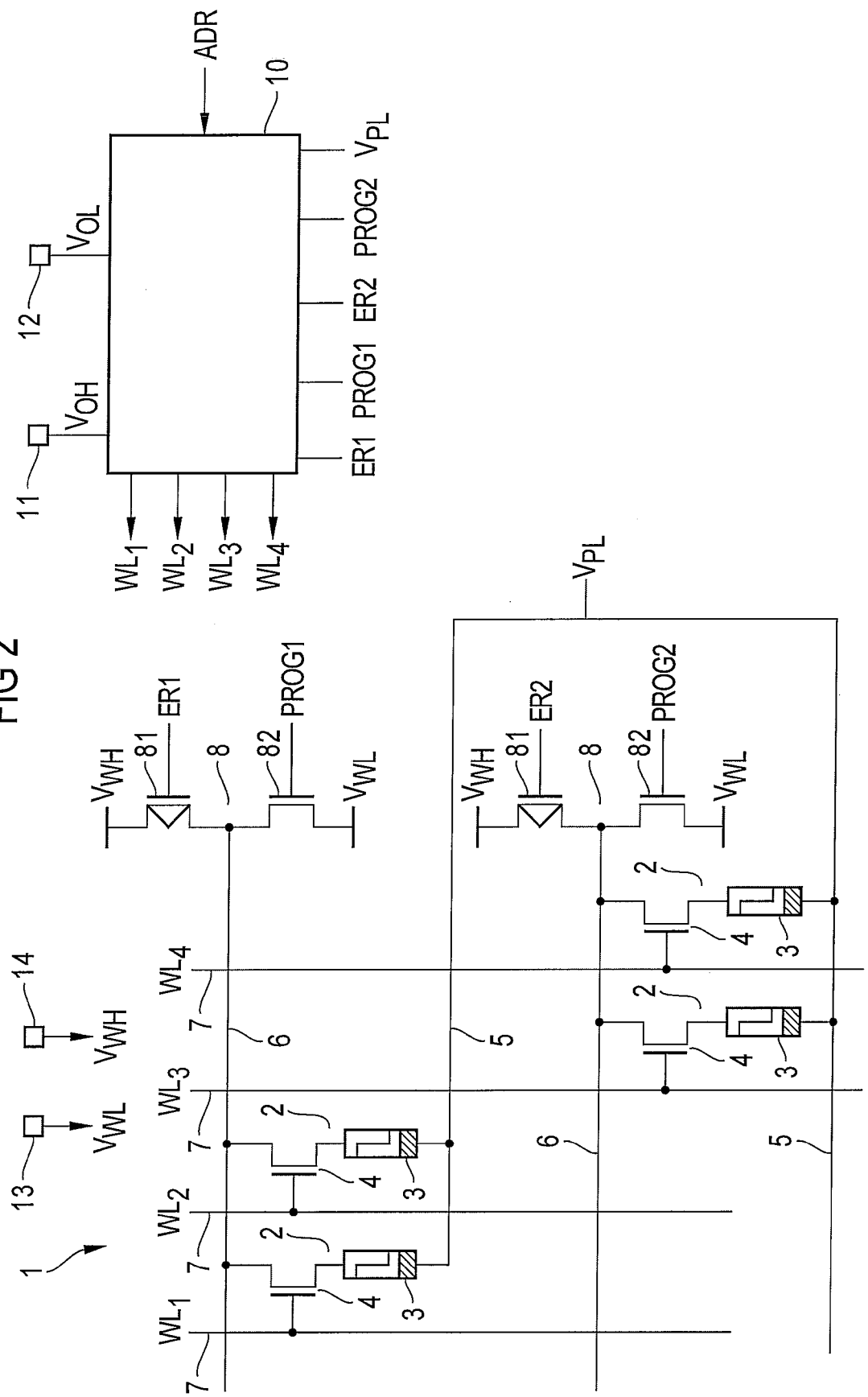
FIG. 2 shows schematically a portion of a CBRAM memory device according to an embodiment of the present invention.

To realize the idea of the present invention a CBRAM memory device is provided as depicted in FIG. 2. The increased writing voltage used for programming or erasing a resistive memory cell is provided by a high $V_{WH}$ and a low writing potential $V_{WL}$ applied to the CBRAM memory device or internally generated by the supplied operating voltage.

In FIG. 2 a circuit diagram of a CBRAM memory device is schematically shown. The CBRAM memory device 1 includes resistive memory cells 2 each including a resistive memory element 3 and a selection transistor 4. The resistive memory cells 2 are coupled to a common plate element 5 to supply a plate potential $V_{PL}$ to the resistive memory cells 2.

In detail, a resistive memory cell 2 is designed as follows:

A first terminal of the resistive memory element 3 is coupled to the plate element 5 and the second terminal of the resistive memory element 3 is coupled to a first terminal of the selection transistor 4. A second terminal of the selection transistor 4 is coupled to a bit line 6 which is provided for a number of resistive memory cells 2. A gate terminal of the selection transistor 4 is coupled to a word line which is further coupled to gate terminals of further selection transistors 4 of further resistive memory cells 2.

An addressing logic 10 is provided which is designed to control memory operations with regard to the resistive memory cells 2. The addressing logic 10 is coupled with the word lines to activate the respective word line which the resistive memory cell 2 to be addressed is connected with. The word line 7 to be addressed is determined depending on an address data ADR e.g. received via an address port 12 of the CBRAM memory device 1 and the addressing logic 10 applies an activation signal $WL_1$-$WL_4$ on the respective word line 7.

Further depending on the provided address data ADR at least one of the bit lines 6 is selected. Each bit line 6 is connected with a bit line driver 8 which comprises a pull-up transistor 81 and a pull-down transistor 82. The bit line drivers 8 may also be regarded as part of the addressing logic 10. In detail the bit line 6 is connected with a first terminal of the pull-up transistor 81 and the pull-down transistor 82. A second terminal of the pull-up transistor 81 is connected to the high writing potential $V_{WH}$. A gate terminal of the pull-up transistor 81 of each of the bit line drivers 8 is controlled with an erase signal ER1, ER2 which is supplied for each of the bit lines 6 by the addressing logic 10. The bit line 6 is further connected with a first terminal of the pull-down transistor 82 a second terminal of which is connected with the low writing potential $V_{WL}$. A gate terminal of the pull-down transistor 82 of each of the bit line drivers 8 is controlled by a programming signal PROG1, PROG2 which may be supplied for each bit line by the addressing logic 10. For instance, the pull-up transistor 81 is provided as a FET transistor of a p-type and the pull-down transistor 82 is provided as a FET transistor of a n-type.

The high writing potential $V_{WH}$ is selected to be higher than the high operating potential $V_{OH}$ which is supplied by a first operating voltage supply pin 11. The low writing potential $V_{WL}$ is selected to be equal to or lower than the low operating potential $V_{OL}$ supplied by a second operating voltage supply pin 12. The plate potential $V_{PL}$ provided on the plate element 5 is preferably selected to be in between the high writing potential $V_{WH}$ and the low writing potential $V_{WL}$. The plate potential $V_{PL}$ is determined at a voltage value which results in substantially equal re-writing times of the respective resistive memory cell when applying the programming and erasing voltage respectively to change the resistive memory element 3 therein to the corresponding resistance state. The plate potential $V_{PL}$ is not necessarily in the middle between the high writing potential $V_{WH}$ and the low writing potential $V_{WL}$. The low and/or the high writing potential $V_{WL}$, $V_{WH}$ can be applied via external writing potential pins 13, 14. The writing potential supply pins 13, 14 are also referred to as writing potential elements. It is also possible that only one writing potential is provided within the CBRAM memory device.

For instance, the operating voltage of a CBRAM memory device is about 1.5 Volt provided by a high operating potential of 1.5 V and a low operating potential is about 0 V (ground potential). A high writing potential is given by 2.7 V and the low writing potential is about 0 V which equals the low operating potential. The plate potential is set to 1.5 V such that a maximum programming voltage of 1.5 V and a maximum erasing voltage of 1.2 V can be applied to the resistive memory element 3.

It may not be necessary that the high writing potential is higher than the high operating potential and the low writing potential is lower than the low operating potential but it is required that given a constant plate potential a higher programming voltage and an erasing voltage can be achieved compared to the prior art CBRAM memory device as described above wherein the plate potential is about in the middle of the operating potential wherein the difference to the respective high or low operating potential is used for programming or erasing the resistive memory element.

Moreover, the high writing potential is set to the high operating potential or the low writing potential is set to the low operating potential such that only one writing potential has to be supplied to the CBRAM memory device or has to be generated within the memory device according to another embodiment.

In FIG. 3 another embodiment of the present invention is shown. FIG. 3 shows a CBRAM memory device 31 having CBRAM memory cells 32 arranged on bit lines 36 and on word lines 37. In contrast to the embodiment of FIG. 2 the CBRAM memory cells 32 do not comprise a selection transistor but only resistive memory elements 33 each of which are coupled between one of the bit lines 36 and one of the word lines 37. An addressing logic 40 is provided to select at least one of the resistive memory cells 32 by changing at least one of the word line and bit line potentials such that only on the addressed resistive memory cells 32 a voltage for writing data is applied. To allow a faster writing into the resistive memory cells 32 a high writing potential $V_{WH}$ supplied on a first writing potential pin 43 and a low writing potential $V_{WL}$ is provided at a second writing potential pin 44. A high and a low operating potential $V_{OH}$, $V_{OL}$ is provided via external operating potential pins 41, 42.

While in a write-mode a data bit is to be written into a selected resistive memory cell 32 the respective word line 37 and the respective bit line 36 are connected with the writing potentials, wherein the potentials of the other word lines and the other bit lines are adapted such that no writing process is performed in the none-addressed resistive memory cells. This can be achieved by providing an "open circuit" to the respective non-addressed word lines and bit lines wherein the non-addressed word lines and bit lines are floating. It is not necessary that no voltage (open circuit) is applied on the other resistive memory cells 32 as long as no changing of their resistance states takes place. However, it is preferred to ensure that on the other resistive memory cells 32 are applied a voltage of about 0 V to reduce the total power consumption of the memory device. The addressing logic 40 is configured to receive the address data ADR and to provide the word line potentials and the bit line potentials by which the resisitive memory cell 32 can be selected and addressed. The addressing logic 40 also receives the operating potentials $V_{OH}$, $V_{OL}$ and the writing potentials $V_{WH}$, $V_{WL}$ which are applied according to the received address data ADR to the respective word lines 37 and bit lines 36.

For each embodiment of the present invention it is possible to provide the writing potentials internally e.g. by means of an internal voltage source also referred to as writing potential elements which generates the writing potential e.g. by means of a charge pump circuit and the like.

While the foregoing is directed to embodiments of the present invention, other and further embodiments of the invention may be devised without departing from the basic scope thereof, and the scope thereof is determined by the claims that follow.

What is claimed is:

1. A memory device, comprising:
   a resistive memory cell including a resistive memory element which can be set to at least a first resistance state by applying a first writing voltage and a second resistance state by applying a second writing voltage;
   operating voltage nodes for receiving a high operating voltage and a low operating voltage;
   an addressing logic which is operated by the high and low operating voltages; and
   at least one writing potential element for providing the first writing voltage wherein the first writing voltage is higher than the high operating voltage when setting the first resistance state and for providing the second writing voltage wherein the second writing voltage is lower than the low operating voltage when setting the second resistance state;

wherein the addressing logic controls the writing potential element to apply any of the first and second writing voltages on the resistive memory element in a write mode.

2. The memory device of claim 1, wherein the resistive memory element assumes a low resistance state upon application of a programming voltage and a high resistance state upon application of an erasing voltage.

3. The memory device of claim 1, further comprising:
a selection transistor included in the resistive memory cell and coupled with its first terminal to a first terminal of the resistive memory element;
a word line coupled to a gate terminal of the selection transistor;
a bit line coupled to a second terminal of the selection transistor;
a plate element connected with a second terminal of the resistive memory element and providing a plate potential,
wherein the addressing logic is configured to control the word line and the bit line such that in the write mode any of the first and second writing voltages is applied on the bit line while the selection transistor is closed.

4. The memory device of claim 3, wherein the addressing logic is configured to control the plate element such that a voltage is applied on the resistive memory element which is higher than a voltage difference between the high and the low operating voltages.

5. The memory device of claim 3, wherein the addressing logic is configured to control the plate element such that the low operating voltage is applied as the plate potential if the writing voltage which is higher than the high operating voltage is applied to the bit line.

6. The memory device of claim 5, wherein the addressing logic is configured to control the plate element such that the high operating voltage is applied as the plate potential if the writing voltage which is lower than the low operating voltage is applied to the bit line.

7. The memory device of claim 3, wherein the plate element provides a constant plate potential which is between the writing voltage and one of the high and the low operating voltages.

8. The memory device of claim 3, wherein a switch is provided to selectively couple the bit line with the writing potential element in the write mode.

9. The memory device of claim 1, wherein a first terminal of the resistive memory element is connected with a word line and a second terminal of the resistive memory element is connected with a bit line; and
wherein the addressing logic is configured to apply either on the bit line or on the word line the writing potential such that in the write mode a voltage applied on the resistive memory element exceeds the high operating voltage.

10. The memory device of claim 1, wherein the writing potential element comprises an internal voltage source.

11. The memory device of claim 1, wherein the writing potential element comprises an external writing potential port.

12. A method for writing to a resistive memory cell in a memory device and having a resistive memory element which can be set to at least a first resistance state by applying a first writing voltage and a second resistance state by applying a second writing voltage, comprising:
providing a high operating voltage and a low operating voltage to the memory device for operating an addressing logic;
supplying a plate potential to a first terminal of the resistive memory element; and
in a write mode, providing any of the first and second writing voltages on a second terminal of the resistive memory element, wherein the first writing voltage is higher than the high operating voltage when setting the first resistance state and wherein the second writing voltage is lower than the low operating voltage when setting the second resistance state.

13. The method of claim 12, wherein a selection transistor is closed prior to applying any of the first and second writing voltages to the second terminal of the resistive memory element.

14. The method of claim 12, wherein a plate potential is controlled such that a voltage is applied on the resistive memory element which is higher than a voltage difference between the high and the low operating voltages.

15. The method of claim 12, wherein the plate potential is controlled such that the low operating voltage is applied as the plate potential if the writing voltage which is higher than the high operating voltage is applied to the bit line.

16. The method of claim 12, wherein the plate potential is controlled such that the high operating voltage is applied as the plate potential if the writing voltage which is lower than the low operating voltage is applied to the bit line.

17. The method of claim 12, wherein the plate potential is set as a constant potential which is selected between the writing voltage and one of the high and the low operating voltages.

18. The method of claim 12, wherein the writing voltage is applied by an internal voltage source.

19. The method of claim 12, wherein the writing voltage is applied by an external writing potential port.

20. The method of claim 12, wherein the resistive memory element is in a resistive memory cell, and wherein the resistive memory element assumes a low resistance state upon application of a programming voltage and a high resistance state upon application of an erasing voltage.

21. A Conductive Bridge Random Access Memory (CBRAM) memory device, comprising:
a resistive memory cell including a resistive memory element, wherein the resistive memory element assumes a low resistance state upon application of a programming voltage and a high resistance state upon application of an erasing voltage; and wherein the resistive memory cell includes a selection transistor and coupled with its first terminal to a first terminal of the resistive memory element;
a word line coupled to a gate terminal of the selection transistor;
a bit line coupled to a second terminal of the selection transistor;
a plate element connected with a second terminal of the resistive memory element and providing a plate potential,
operating voltage ports for receiving a high operating voltage and a low operating voltage;
an addressing logic which is operated by the high and low operating voltages; and
at least one writing potential element for providing a writing voltage wherein the writing voltage is the programming voltage being higher than the high operating voltage to set the low resistance state, and wherein the writing voltage is the erasing voltage being lower than the low operating voltage to set the high resistance state;

wherein the addressing logic controls the writing potential element to apply the writing voltage on the resistive memory element in a write mode; and wherein the addressing logic is configured to control the word line and the bit line such that in the write mode the writing voltage is applied on the bit line while the selection transistor is closed.

22. The CBRAM memory device of claim 21, wherein the addressing logic is configured to control the plate element such that a voltage is applied on the resistive memory element which is higher than a voltage difference between the high and the low operating voltages.

23. The CBRAM memory device of claim 21, wherein the addressing logic is configured to control the plate element such that the low operating voltage is applied as the plate potential if the writing voltage which is higher than the high operating voltage is applied to the bit line.

* * * * *